(12) United States Patent
Corbin, Jr. et al.

(10) Patent No.: US 6,449,162 B1
(45) Date of Patent: Sep. 10, 2002

(54) REMOVABLE LAND GRID ARRAY COOLING SOLUTION

(75) Inventors: John S. Corbin, Jr., Austin; Victor H. Mahaney, Jr., Cedar Park, both of TX (US); Roger R Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/876,085

(22) Filed: Jun. 7, 2001

(51) Int. Cl.[7] .................................................. H05K 7/20
(52) U.S. Cl. ........................ 361/719; 257/719; 361/715; 439/66; 439/485
(58) Field of Search ............................ 439/66, 73, 485, 439/487; 174/16.3, 252; 165/80.3, 185; 257/706, 707, 712, 713, 717–719, 726, 727; 361/703–705, 715, 717–719, 698; 29/832, 840, 890.03, 890.035

(56) References Cited

U.S. PATENT DOCUMENTS 5,473,510 A * 12/1995 Dozier, II ................... 361/719
6,014,315 A * 1/2000 McCullough et al. ........ 361/704
6,084,178 A * 7/2000 Cromwell .................. 174/35 R
6,166,908 A * 12/2000 Samaras et al. ............. 361/700
6,173,760 B1 * 1/2001 Gardell et al. ............. 165/80.4
6,208,515 B1 * 3/2001 Klein ......................... 361/704
6,252,774 B1 * 6/2001 Rife ........................... 361/704
6,330,745 B1 * 12/2001 Cromwell et al. ............ 29/832

* cited by examiner

Primary Examiner—Gerald Tolin
(74) Attorney, Agent, or Firm—Cardinal Law Group; Casimer K. Salye

(57) ABSTRACT

A land grid array (LGA) cooling assembly and method of a cooling member assembly are provided. The LGA assembly includes a card, a module electrically connected to the card, a plurality of load posts operably attached to the card, a load frame operably attached to the load posts, and a cooling member operably attached to the load frame to allow removal of the cooling member from the assembly without disrupting the electrical connection between the module and the card. The method of assembling a land grid array cooling member assembly includes electrically connecting a module and a card, operably connecting a load frame to the card, and removably attaching a cooling member the load frame without affecting the electrical connection between the module and the card.

20 Claims, 5 Drawing Sheets

REMOVABLE LAND GRID ARRAY COOLING SOLUTION

TECHNICAL FIELD OF THE INVENTION

The present invention relates to land grid arrays, and more specifically, the invention relates to a removable land grid array cooling solution assembly and a method of assembling the same.

BACKGROUND OF THE INVENTION

Electronic components such as modules are often permanently soldered to a circuit board. In contrast, a land grid array (LGA) module is socketed to the circuit board through an area array connector. Socketing of modules in a LGA assembly provides many advantages, among them field upgradability, flexibility in the system bring-up and diagnosis, reduced board assembly rework cost, reduced effects of thermal mismatch between module and board, improved electrical performance, and an adaptability to compact mechanical designs.

As shown in FIGS. 1 and 2, current applications of LGA assemblies 10 may include a cooling solution 11 such as a heatsink, heatpipe, fansink, or coldplate disposed on a module 13. The cooling solution 11 has two functions: to serve as the heat dissipation medium, and to serve as one of the structural load plates that is required for making the electrical connection. An area array connector device provides an electrical connection between mating surfaces of the module 13 and a printed circuit board 15 through a conductive interposer 14 that is compressed between the module 13 and the board 15. The LGA assembly 10 also includes a backside mount comprising: an insulator 16, a backside stiffener 17, a springplate assembly with threaded bushing 18, and a load screw 19. The backside mount is attached to cooling solution 11 via load posts 12, which engages keyhole features in the springplate 18. Turning the load screw 19 develops a compressive force within the assembly 10. The compressive force maintains the electrical connection between the module 13 and the board 15.

Removal of the cooling solution 11 is accomplished by loosening the load screw 19, disengaging the load posts 12 from the springplate 18 keyhole features, and pulling the cooling solution 11 and load posts 12 from the assembly 10. This action not only removes the cooling solution 11 but also breaks the electrical connection of the socket. Furthermore, removal of the cooling solution 11 may cause the module 13, interposer 14, insulator 16, backside stiffener 17, and springplate 18 to become loose and unconstrained parts.

One shortcoming of the current designs is that when the cooling solution is removed from the LGA assembly, the electrical connection is broken. This is disadvantageous because subsequent reassembly may result in a bad connection due to improper reloading or alignment of the electrical connection, introduction of contamination into the connection, and increased wear of the connection due to repeated assembly-disassembly. The cooling solution may need to be removed and replaced without breaking the electrical connection due to a need to test the card in a development or manufacturing environment with an alternative cooling scheme different from that employed on the actual product. Other reasons for cooling solution removal and/or replacement include failure of the cooling solution on a functional card and shipment and/or stocking of fully functional cards without the cooling solution.

Another shortcoming of the current designs relates to occasions when the cooling solution may not be removed from the system. Fixed cooling solutions include those employing liquid or refrigeration cooling assemblies that circulate a thermal fluid through pipes/hoses to coldplates attached to the modules to be cooled. It would be desirable, then, to allow for functional cards to be moved from slot to slot within a given machine or from machine to machine without breaking the electrical connection or disrupting the fixed cooling solution. Additionally, failed cards could be removed from the system and analyzed with an intact electrical connection.

In summary, socketing of modules in LGA assemblies provides many advantages including upgradability, flexibility, reduced cost and thermal mismatch, and improved system performance and adaptability. The current assembly designs, however, prohibit the cooling solution from being removed without breaking the electrical connection between the module and the circuit board. Therefore, it would be desirable to achieve a LGA assembly capable of repeated cooling solution assembly-disassembly without disruption of the module-board electrical connection. The novel LGA assembly should overcome the aforementioned and other disadvantages.

SUMMARY OF THE INVENTION

One aspect of the invention provides a land grid array cooling assembly comprising: a card, a module electrically connected to the card, a plurality of load posts operably attached to the card, a load frame operably attached to the load posts, and a cooling member operably attached to the load frame to allow removal of the cooling member from the assembly without disrupting the electrical connection between the module and the card. A backside mount may be positioned adjacent the card, wherein the backside mount may be operably attached to the load posts. An area array connector may be positioned between the card and the module wherein the area array connector may provide an electrical connection between the card and the module. The electrical connection may comprise a socket connection. The cooling member may be any thermal solution, including a heatsink, a heatpipe, a fansink, or a coldplate. At least one bolt may operably attach the cooling member to the load frame. A clip may operably attach the cooling member to the load frame. The load frame may facilitate a thermal transfer between the module and the cooling member. The load frame may provide a load force onto the module thereby maintaining the electrical connection between the card and the module.

Another aspect of the invention provides a method of assembling a land grid array cooling member assembly comprising: electrically connecting a module and a card, operably connecting a load frame to the card, and removably attaching a cooling member to the load frame without affecting the electrical connection between the module and the card. An area array connector may be positioned between the card and the module. An electrical connection may be provided between the card and the module with the area array connector. The electrical connection may comprise a socket connection. A backside mount may be positioned adjacent the card. The backside mount may be operably attached to the load frame. Operably attaching the backside mount to the load frame may produce the electrical connection between the module and the card. The cooling member may be any thermal solution, including a heatsink, a heatpipe, a fansink, or a coldplate. The cooling member may be operably attached to the load frame with at least one bolt. The cooling member may be clipped to the load frame. A thermal transfer may be provided between the module and the cooling member. A load force may be provided onto the module, and the electrical connection between the card and the module may be maintained.

The foregoing and other features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENT

Figure 1:
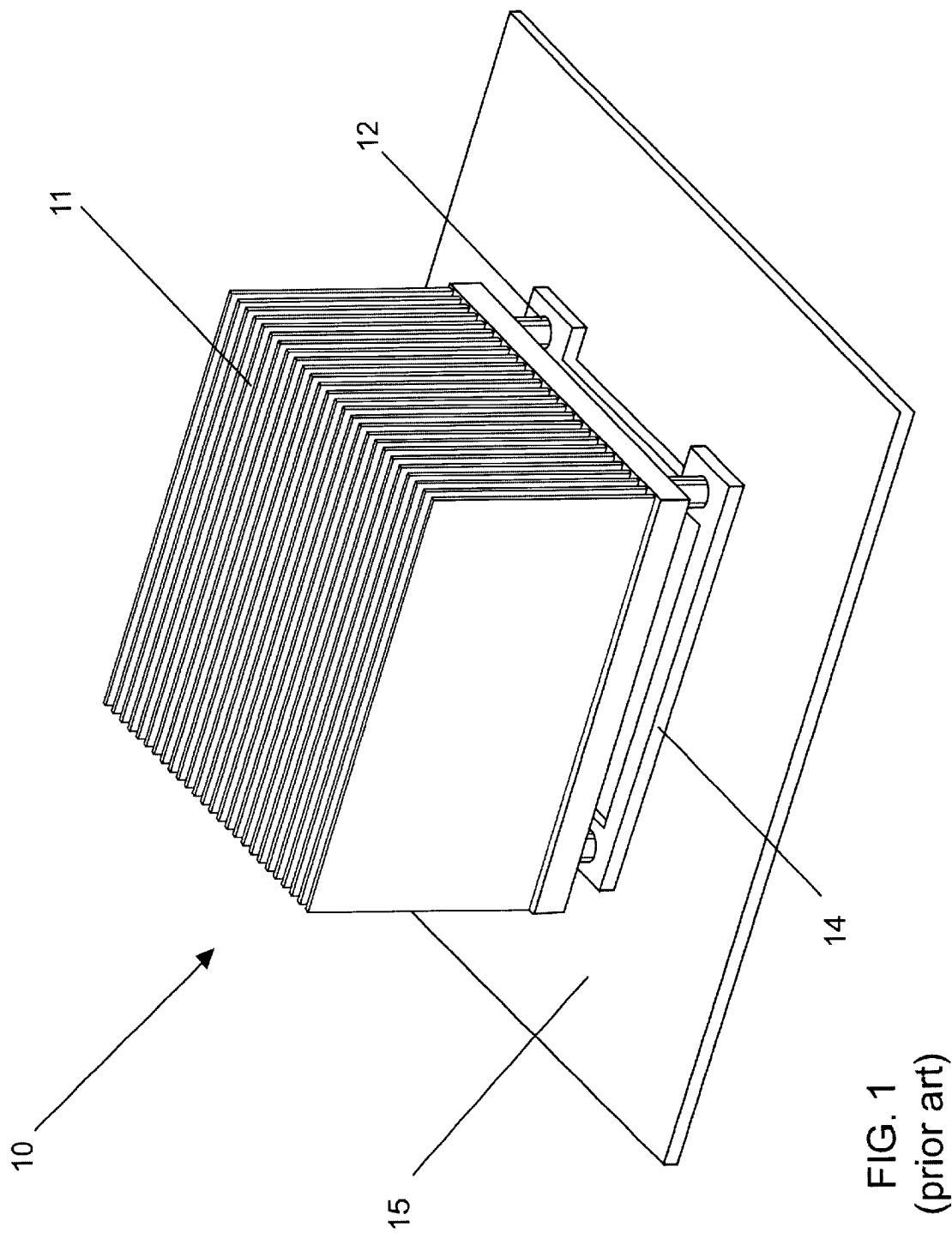
FIG. 1 is a perspective view of a prior art land grid array assembly with cooling solution.
Figure 2:
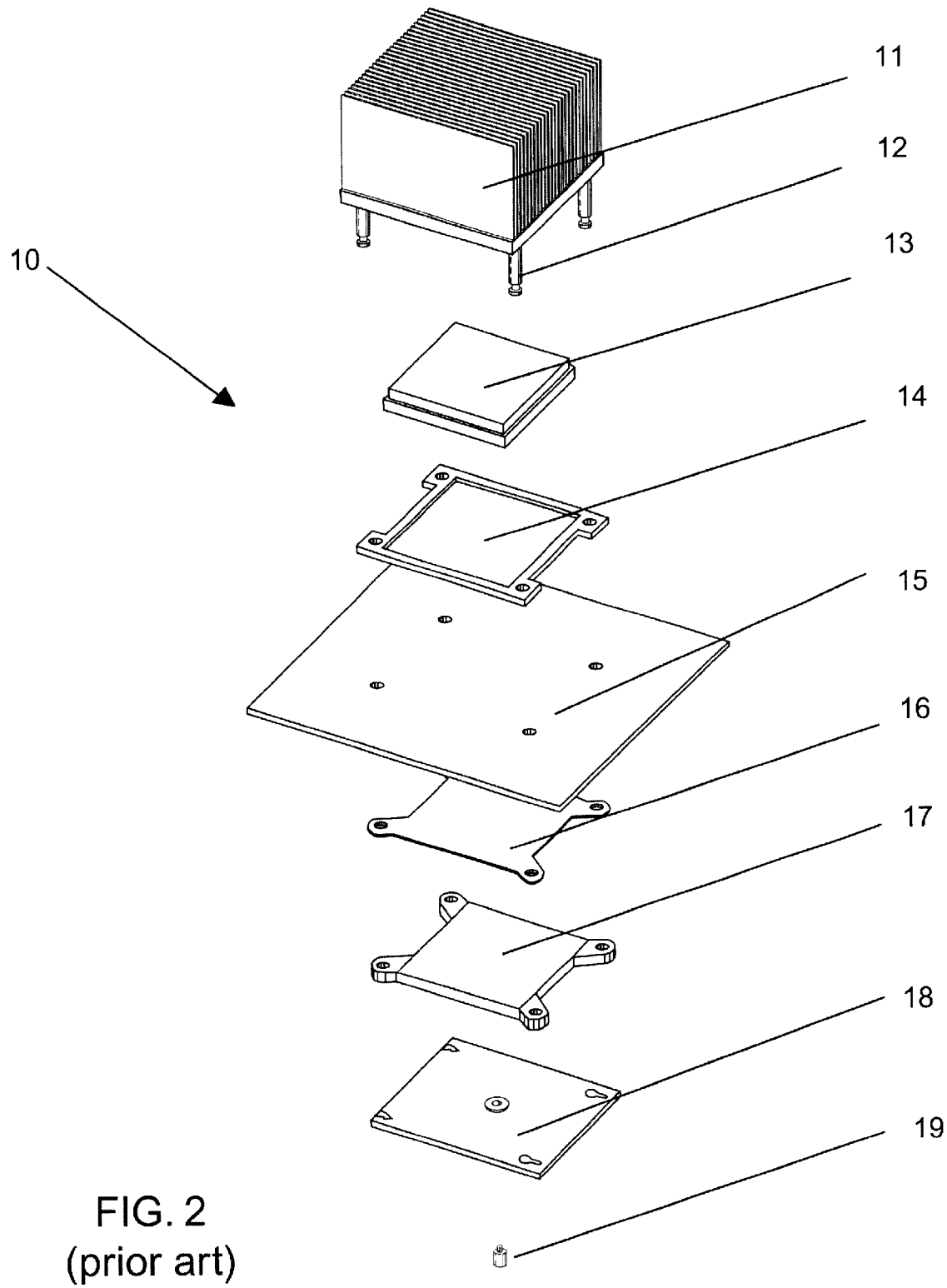
FIG. 2 is an exploded view of the assembly of FIG. 1.
Figure 3:
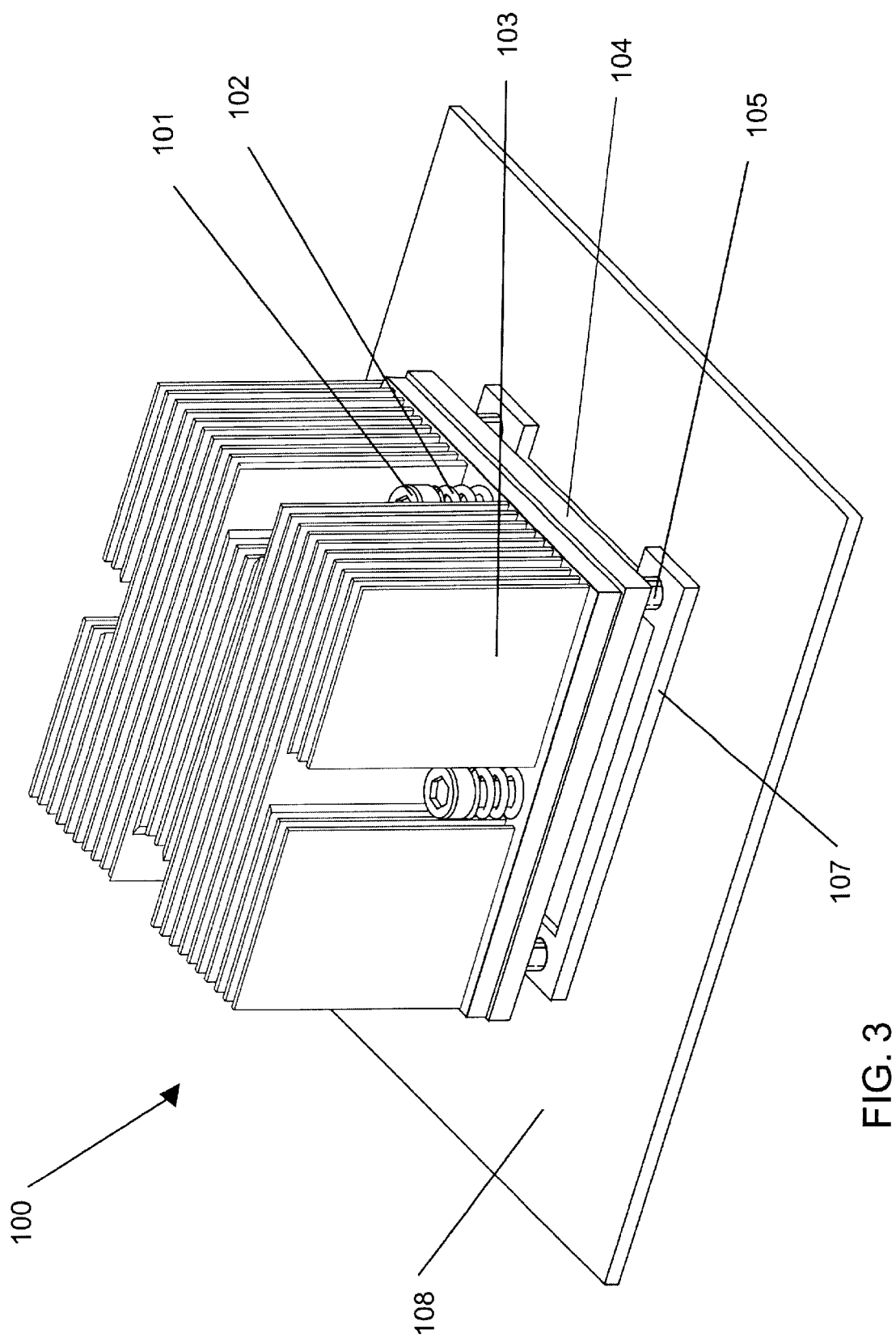
FIG. 3 is a perspective view of one embodiment of a land grid array cooling assembly in accordance with the present invention.
Figure 4:
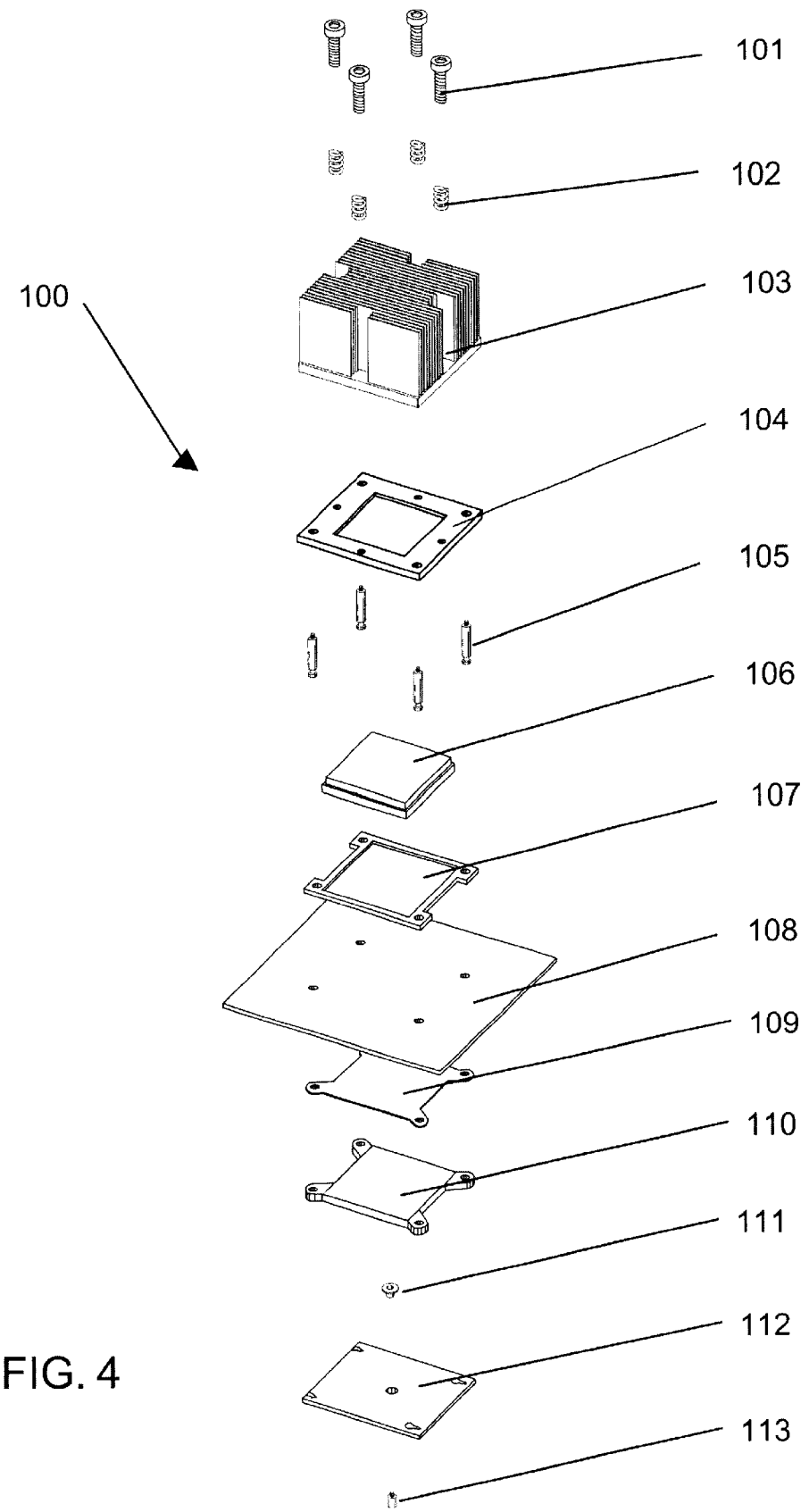
FIG. 4 is an exploded view of the assembly of FIG. 3.
Figure 5:
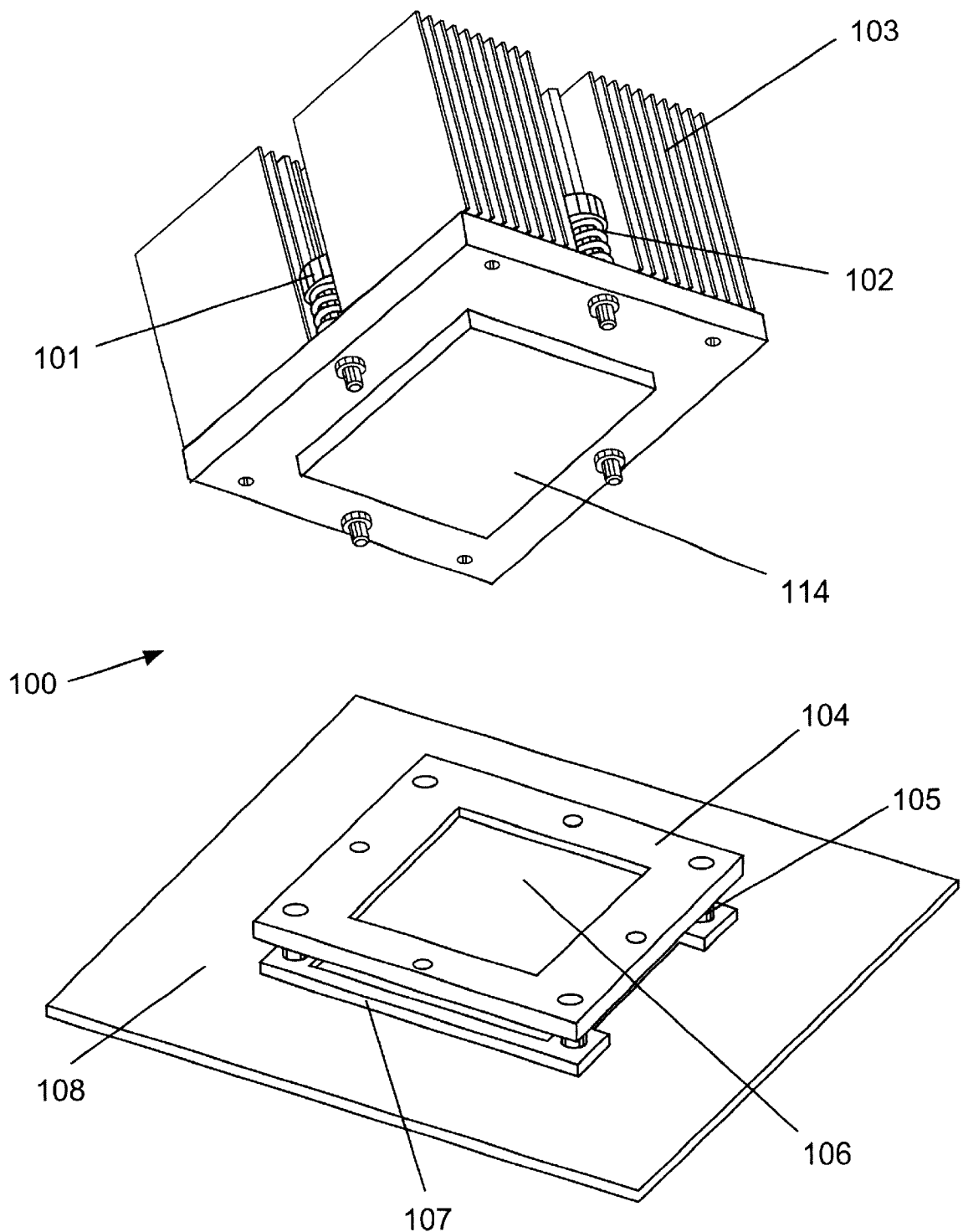
FIG. 5 is an alternate perspective view of the assembly of FIG. 3.

Referring to the drawings, illustrated in FIGS. 3, 4, and 5 is a schematic overview of one embodiment of the present invention designated in the aggregate as numeral 100. The land grid array (LGA) cooling assembly 100 may include a card 108, a module 106 electrically connected to the card 108, a plurality of load posts 105 operably attached to the card 108, a load frame 104 operably attached to the load posts 105, and a cooling member 103 operably attached to the load frame 104 to allow removal of the cooling member 103 from the assembly 100 without disrupting the electrical connection between the module 106 and the card 108.

Those skilled in the art will recognize that a variety of cooling members may be utilized with the present invention including a heatsink, heatpipe, fansink, coldplate, or other suitable cooling solution. The cooling member 103 may be an integral part of the actuation hardware and may serve as a structural element that produces an ancillary compressive force on the module 106. In one embodiment, the cooling member 103 may be a heatsink. In another embodiment, a coldplate may be part of a fluid cooling assembly. The fluid cooling assembly may employ a liquid or refrigeration system circulating a thermal fluid through pipes/hoses to the coldplate. Furthermore, the coldplate may be in thermal contact with the module and may include inlet and outlet fluid lines.

The load frame 104 may facilitate a thermal transfer between the module 106 and the cooling member 103. As shown in FIG. 5., the cooling member 103 may comprise a pedestal 114 that fits within an access hole provided in the load frame 104. The load frame 104 may provide perimeter contact with the module 106 while the access hole may provide means for the cooling member 103 to contact the module 106. The pedestal 114 may directly serve to produce the thermal transfer with the module 106 and to produce the ancillary compressive force on the module 106. In one embodiment, the load frame 104 may include a circular hole that mates with the cooling member 103. In another embodiment, the load frame may not have an access hole and the cooling solution may interface with a top surface of the frame. This arrangement may be useful for modules with low cooling requirements or system environments lacking extreme conditions.

In one embodiment, at least one bolt 101 may operably attach the cooling member 103 to the load frame 104. In one embodiment, four bolts 101 attach the cooling member 103 to the load frame 104. Springs 102 may be positioned coaxially with the bolts 101. Those skilled in the art will recognize that the cooling member 103 may be attached to the load frame 104 using a variety of attachment means. In other embodiments, for example, the cooling member 103 may be attached to the load frame 104 using an adhesive, an adhesive post arrangement, threaded holes with mating posts, spring clips, torsion clips, or combinations thereof.

The load frame 104 may serve as a structural load plate and a structural anchor for the cooling member 103. The load posts 105 are operably attached to the load frame 104 and to the card 108. In one embodiment, the load posts 105 may fit through pre-drilled holes in the card 108 to provide a means for operable attachment. In one embodiment, the load frame 104 provides an integral means for producing a load force onto the module 106. The load force maintains the electrical connection between the card 108 and the module 106.

In one embodiment, the card 108 may include a printed circuit board for use in a computer system (not shown). An area array connector device may provide an electrical connection between mating surfaces of the module 106 and the card 108 through a conductive interposer 107 that is compressed between the module 106 and the card 108. The electrical connection may comprise a socket connection. Socketing of the module may provide many advantages over soldering, among them field upgradability, flexibility in the system bring-up and diagnosis, reduced board assembly rework cost, reduced effects of thermal mismatch between module and board, improved electrical performance, and an adaptability to compact mechanical designs.

In one embodiment, the assembly 100 may include a backside mount positioned adjacent the card, wherein the backside mount may be operably attached to the load posts 105. The backside mount may comprise an insulator 109, a backside stiffener 110, a springplate 112 with threaded bushing 111, and a load screw 113. The backside mount may be attached to the load frame 104 via load posts 105 to provide the load force within the assembly 100. As the load screw 113 is turned, a force is developed by the springplate 112 that is transmitted through the load posts 105 to create a compressive load between the load frame 104 and the backside stiffener 110. This provides the load force that is required to create the electrical connection between the module 106 and the card 108 via the interposer 107. Furthermore, the springplate 112 and the load frame 104 may serve as the structural load plates for the embodiment. The aforementioned ancillary compressive force may also contribute to the load force on the module 106, but may not be necessary to maintain the electrical connection.

The cooling member 103 may be detached from the assembly 100 without breaking the electrical connection between the module 106 and the card 108. In one embodiment, the detachment is accomplished by unscrewing the four bolts 101 and removing the cooling member 103 from the load frame 104. Since the load frame 104 and not the cooling member 103 provides the load force, the electrical connection is maintained. The cooling member 103 and/or the remaining assembly may then be replaced, serviced, transported, swapped, or the like independently of one another. As described previously, removing the cooling member 103 without disruption of the electrical connection may provide numerous advantages over the prior art.

In one embodiment, the cooling member assembly 100 may be assembled by electrically connecting the module 106 and the card 108, operably connecting the load frame 104 to the card 108, and removably attaching the cooling member 103 to the load frame 104 without affecting the electrical connection between the module 106 and the card 108. The backside mount may be positioned adjacent the card 108, and the backside mount may be operably attached to the load posts 105. The area array connector 107 may be positioned between the card 108 and the module 106, and may provide an electrical connection. The array connector 107 may be an LGA interposer. The cooling member 103 may be attached to the load frame 104 with at least one bolt, a clip, or other aforementioned attachment means. A thermal transfer may be provided between the module 106 and the cooling member 103. A load force may be provided onto the module 106 and the electrical connection between the card 108 and the module 106 is maintained. The load force may be developed by the aforementioned procedure of tightening the load screw 113.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. A land grid array (LGA) cooling assembly electrically connecting a land grid array (LGA) module to a circuit card; the LGA cooling assembly comprising:

a load frame contacting an outer periphery of a top surface of the LGA module and clamping the module between the load frame and the card;

a plurality of load posts operably attached to the card, extending outward from the card past the module, and engaging the load frame for clamping the module in electrical contact with the card;

the load frame having an opening therein exposing a portion of the top surface of the module within the outer periphery of the top surface of the module;

a cooling member having a pedestal extending therefrom through the opening in the load frame providing thermally conductive contact between the pedestal and the exposed portion of the top surface of the module; and means for attaching the cooling member to the load frame and urging the pedestal in to and out of thermally conductive contact with the exposed portion of the top surface of the module, without rotation of the cooling module in relation to the load frame and module, thereby allowing the cooling member to be attached and detached from the load frame without disturbing the electrical connection of the module with the card and without imposing rotational forces against the exposed top surface of the module.

2. The assembly of claim 1 further comprising a backside mount positioned adjacent the card, wherein the backside mount is operably attached to the load posts.

3. The assembly of claim 1 further comprising an area array connector positioned between the card and the module wherein the area array connector provides an electrical connection between the card and the module.

4. The assembly of claim 3 wherein the electrical connection comprises a socket connection.

5. The assembly of claim 1 wherein the cooling member comprises one member from a group consisting of: a heatsink, a heatpipe, a fansink, and a coldplate.

6. The assembly of claim 1 wherein the means for attaching the cooling member to the load frame and urging the pedestal in to and out of thermally conductive contact with the exposed portion of the top surface of the module includes at least one bolt operably attaching the cooling member to the load frame.

7. The assembly of claim 1 wherein the means for attaching the cooling member to the load frame and urging the pedestal in to and out of thermally conductive contact with the exposed portion of the top surface of the module includes spring means operably attaching the cooling member to the load frame for limiting clamping force exerted against the module by the pedestal.

8. The assembly of claim 1 wherein the load frame facilitates a thermal transfer between the module and the cooling member.

9. The assembly of claim 1 wherein the cooling member provides a load force onto the module for augmenting the clamping force exerted by the load frame against the module in maintaining the electrical connection between the card and the module.

10. A method electrically connecting a land grid array (LGA) module to a circuit card using a land grid array (LGA) cooling assembly having:

a load frame for contacting an outer periphery of a top surface of the LGA module and clamping the module between the load frame and the card;

a plurality of load posts operably attached to the card, extending outward from the card past the module, and engaging the load frame for clamping the module in electrical contact with the card;

the load frame having an opening therein exposing a portion of the top surface of the module within the outer periphery of the top surface of the module;

a cooling member having a pedestal extending therefrom through the opening in the load frame providing thermally conductive contact between the pedestal and the exposed portion of the top surface of the module; and means for attaching the cooling member to the load frame and urging the pedestal in to and out of thermally conductive contact with the exposed portion of the top surface of the module, without rotation of the cooling module in relation to the load frame and module, thereby allowing the cooling member to be attached and detached from the load frame without disturbing the electrical connection of the module with the card and without imposing rotational forces against the exposed top surface of the module;

the method comprising:

positioning the module against the card and the load frame against the outer periphery of the upper surface of the module;

clamping the module between the load frame and the card by engaging the load frame with the load posts;

positioning the pedestal of the cooling member within the opening of the load frame in thermal contact with the exposed portion of the top surface of the module; and attaching the cooling member to the load frame.

11. The method of claim 10 further comprising positioning an area array connector between the card and the module, and providing an electrical connection between the card and the module with the area array connector.

12. The method of claim 11 wherein the electrical connection comprises a socket connection.

13. The method of claim 10 further comprising positioning a backside mount adjacent the card, and operably attaching the backside mount to the load frame.

14. The method of claim 13 wherein operably attaching the backside mount to the load frame produces the electrical connection between the module and the card.

15. The method of claim 10 wherein the cooling member comprises one member from a group consisting of: a heatsink, a heatpipe, a fansink, and a coldplate.

16. The method of claim 10 further comprising operably attaching the cooling member to the load frame with at least one bolt.

17. The method of claim 10 wherein the means for attaching the cooling member to the load frame and urging the pedestal in to and out of thermally conductive contact with the exposed portion of the top surface of the module includes spring means operably attaching the cooling member to the load frame for limiting clamping force exerted against the module by the pedestal, and the method further includes limiting the clamping force exerted against the module by the pedestal.

18. The method of claim 10 further comprising providing a thermal transfer between the module and the cooling member.

19. The method of claim 10 wherein the cooling member provides a load force onto the module for augmenting the clamping force exerted by the load frame against the module in maintaining the electrical connection between the card and the module, and the method includes augmenting the augmenting the clamping force exerted by the load frame against the module with the load force exerted by the cooling member.

20. The method of claim 10 further comprising detaching the cooling member from the load frame and leaving the module clamped to the card by the load frame.

* * * * *

UNITED STATES PATENT AND TRADEMARK OFFICE
CERTIFICATE OF CORRECTION

PATENT NO. : 6,449,162 B1
DATED : September 10, 2002
INVENTOR(S) : Corbin, Jr. et al.

It is certified that error appears in the above-identified patent and that said Letters Patent is hereby corrected as shown below:

<u>Title page,</u>
Item [74], *Attorney, Agent, or Firm*, replace the current text with -- Cardinal Law Group, Casimer K. Salys --

Signed and Sealed this

Twentieth Day of April, 2004

JON W. DUDAS
*Acting Director of the United States Patent and Trademark Office*